United States Patent
Ohya et al.

(10) Patent No.: US 6,838,891 B2
(45) Date of Patent: Jan. 4, 2005

(54) SEMICONDUCTOR DEVICE

(75) Inventors: Mitsuyoshi Ohya, Osaka (JP); George Nakane, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 215 days.

(21) Appl. No.: 10/119,560

(22) Filed: Apr. 9, 2002

(65) Prior Publication Data
US 2002/0145440 A1 Oct. 10, 2002

(30) Foreign Application Priority Data
Apr. 9, 2001 (JP) .................................... 2001-109990

(51) Int. Cl.$^7$ .......................... G11C 29/00; G01R 31/26
(52) U.S. Cl. ................... 324/754; 324/765; 324/158.1; 365/201; 438/14; 438/17
(58) Field of Search ............................ 324/765, 158.1, 324/754, 763, 758, 72.5; 438/17, 18, 19, 14; 365/201, 226, 200; 257/48

(56) References Cited

U.S. PATENT DOCUMENTS

| | | | |
|---|---|---|---|
| 4,860,260 A | * | 8/1989 | Saito et al. ................. 365/201 |
| 5,059,899 A | | 10/1991 | Farnworth et al. |
| 5,214,657 A | | 5/1993 | Farnworth et al. |
| 5,619,462 A | * | 4/1997 | McClure ..................... 365/201 |
| 5,883,008 A | * | 3/1999 | McClure ..................... 438/737 |
| 5,981,971 A | | 11/1999 | Miyakaw |
| 6,452,415 B1 | * | 9/2002 | Farnworth et al. .......... 324/765 |

FOREIGN PATENT DOCUMENTS

| | | | | |
|---|---|---|---|---|
| JP | 03185756 A | * | 8/1991 | ........... H01L/27/04 |
| JP | 06061298 A | * | 4/1994 | ........... H01L/21/60 |
| JP | 11031785 A | * | 2/1999 | ........... H01L/27/04 |

* cited by examiner

Primary Examiner—Kamand Cuneo
Assistant Examiner—Jimmy Nguyen
(74) Attorney, Agent, or Firm—Merchant & Gould P.C.

(57) ABSTRACT

A semiconductor device includes a plurality of semiconductor integrated circuits formed on a semiconductor wafer; an testing pad for inputting and outputting a signal to and from an internal circuit of the semiconductor integrated circuit; a switch for switching a state of a connection between the semiconductor integrated circuit and the testing pad; and a wiring pattern formed on a parting line around the semiconductor integrated circuit and connected to an input terminal of the switch. When the semiconductor integrated circuits are separated, cutting off of the wiring pattern causes the switch to be turned off, so that the internal circuit is prevented from being affected by the influence of the cutting plane.

13 Claims, 3 Drawing Sheets

SEMICONDUCTOR DEVICE

FIELD OF THE INVENTION

The present invention relates to a semiconductor device, in particular, to a semiconductor device provided with testing pads for inputting and outputting signals to and from an internal circuit of a semiconductor integrated circuit during testing, which are formed on a semiconductor wafer.

BACKGROUND OF THE INVENTION

FIG. 6 is a partial plan view showing a conventional semiconductor device in which a plurality of semiconductor integrated circuits are formed on a semiconductor wafer. The plurality of semiconductor integrated circuits 1 are arranged on the semiconductor wafer and parting lines 2 are formed between the semiconductor integrated circuits 1. In order to input and output signals between an internal circuit 3 formed in the semiconductor integrated circuit 1 and the outside, testing pads 4 to be used during test and bonding pads 5 to be used after packaging of a product after the test are connected to the internal circuit 3 via wires 6.

On the other hand, testing pads 7 to be used only during test are arranged on the parting line 2 and connected to the internal circuit 3 via wires 8, as shown in FIG. 6. This is because the area of the semiconductor integrated circuit 1 increases as the number of the testing pads 4 formed within the semiconductor integrated circuit 1 increases. When the plurality of semiconductor integrated circuits 1 are cut apart along the parting lines 2 after the test, the testing pads 7 are cut away. Thus, it becomes possible to test the internal circuit 3 without increasing the area of the semiconductor integrated circuit 1.

However, in this case, there is a risk of malfunctioning of the semiconductor integrated circuit 1 because the cutting planes of the wires 8 may be short-circuited with a power supply, a ground power supply or any of the other signal lines when the semiconductor integrated circuits 1 are cut apart along the parting lines 2. For this reason, fuses 9 to be melted off when current flows through them, for example, can be provided in the wires 8 connecting the testing pads 7 to the internal circuit 3, so that even when the wires 8 are short-circuited, the internal circuit 3 can be prevented from being affected by that.

In order to determine the pass/fail of the semiconductor integrated circuit 1 exactly and to reduce the testing time for measuring a large number of test items, it is necessary to provide the multiple testing pads 7 for inputting signals in parallel. Moreover, it is effective to arrange as many testing pads 7 as possible on the parting lines 2 in order to reduce the area of the semiconductor integrated circuit 1.

However, it is difficult to individually and reliably cut off the fuses 9 provided in the wires 8 that are connected to all of the testing pads 7 arranged on the parting lines 2. Furthermore, an additional processing step of cutting off the respective fuses 9 is needed, which increases the testing time.

SUMMARY OF THE INVENTION

It is an object of the present invention to provide a semiconductor device in which multiple testing pads can be arranged on a parting line, while avoiding malfunctions due to cutting of the testing pads and the testing circuit arranged on the a parting line, without requiring additional steps and increasing the testing time.

A semiconductor device having the first configuration according to the present invention includes a plurality of semiconductor integrated circuits formed on a semiconductor wafer; an testing pad for inputting and outputting a signal to and from an internal circuit of the semiconductor integrated circuit; a switch that switches a state of a connection between the semiconductor integrated circuit and the testing pad; and a wiring pattern formed on a parting line around the semiconductor integrated circuit and connected to a wire for providing a signal for controlling the on/off state of the switch.

The testing pad may be formed either on the semiconductor integrated circuit or on the parting line.

A semiconductor device having the second configuration according to the present invention includes a plurality of semiconductor integrated circuits formed on a semiconductor wafer; an testing circuit for testing the semiconductor integrated circuit, which is formed on a parting line around the semiconductor integrated circuit; an testing pad for inputting and outputting a signal to and from the testing circuit; a switch that switches respective states of a connection between the semiconductor integrated circuit and the testing circuit and a connection between the testing circuit and the testing pad; and a wiring pattern formed on a parting line and connected to a wire for providing a signal for controlling the on/off state of the switch.

According to these configurations, it is possible to ensure that the internal circuit is prevented from being affected by the influence of a cutting plane when the testing pad or the testing circuit arranged on the parting line is cut off. Therefore, it is possible to arrange the multiple testing pads on the parting line, while additional steps beyond separating the semiconductor integrated circuit along the parting line, which have been performed conventionally, are not needed and the testing time is not increased.

A semiconductor device having the third configuration according to the present invention includes a plurality of semiconductor integrated circuits formed on a semiconductor wafer; an operation mode selector pad for switching a mode of operation of the semiconductor integrated circuit; a switch that switches a state of a connection between the semiconductor integrated circuit and the operation mode selector pad; and a wiring pattern formed on a parting line around the semiconductor integrated circuit and connected to a wire for providing a signal for controlling the on/off state of the switch.

According to this configuration, the mode of operation is fixed after separating the semiconductor integrated circuits along the parting line, so that malfunctions can be prevented. Furthermore, since it becomes impossible to input and output signals by using the testing pad, high security can be assured.

The operation mode selector pad may be formed either on the semiconductor integrated circuit or on the parting line around the semiconductor integrated circuit.

In the first configurations, the wiring pattern may be formed such that it leads from inside the semiconductor integrated circuit over the parting line and then is connected to the inside of the same semiconductor integrated circuit, and the wiring pattern is arranged such that it is cut off when the plurality of the semiconductor integrated circuits are separated along the parting line.

In this configuration, it is preferable that the cutting off of the wiring pattern causes the switch to be turned from on to off, so that the input/output processing of signals to and from the testing pad is made electrically ineffective.

Also it is preferable that in the above-described configuration, the cutting off of the wiring pattern causes an output signal from the switch to be fixed, so that the input/output processing of signals to and from the testing pad is made electrically ineffective.

In the third configurations, the wiring pattern may be formed such that it leads from inside the semiconductor integrated circuit over the parting line and then is connected to the inside of the same semiconductor integrated circuit, and the wiring pattern is arranged such that it is cut off when the plurality of the semiconductor integrated circuits are separated along the parting line.

In this configuration, it is preferable that in the above-mentioned configuration, the cutting off of the wiring pattern causes the switch to be turned from on to off, so that the input/output processing of signals to and from the operation mode selector pad is made electrically ineffective.

Also it is preferable that in the above-described configuration, the cutting off of the wiring pattern causes the output signal from the switch to be fixed, so that the input/output processing of signals to and from the operation mode selector pad is made electrically ineffective.

Also it is preferable that the cutting off of the wiring pattern causes the mode of operation of the semiconductor integrated circuit to be fixed.

DETAILED DESCRIPTION OF THE INVENTION

Embodiment 1

Figure 1:
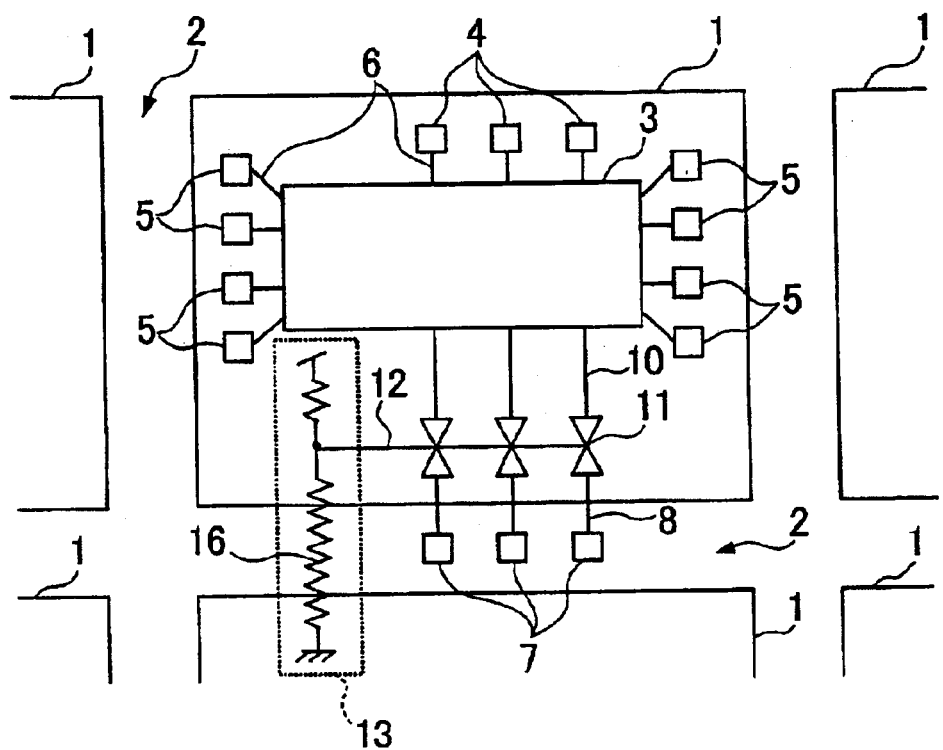
FIG. 1 is a partial plan view showing a semiconductor device according to Embodiment 1.

FIG. 1 shows a semiconductor device according to Embodiment 1 of the present invention. This semiconductor device includes a plurality of semiconductor integrated circuits 1 and parting lines 2 formed on a semiconductor wafer. Testing pads 4 and bonding pads 5 are arranged in order to input and output signals between an internal circuit 3 formed in the semiconductor integrated circuit 1 and the outside, and connected to the internal circuit 3 via wires 6. In addition, testing pads 7 to be used only during test are arranged on the parting lines 2 and connected to the internal circuit 3 via wires 8, wires 10 and switches 11. The testing pads 7 are cut away when the plurality of semiconductor integrated circuits 1 are separated from each other by cutting along the parting lines 2.

The switches 11 are elements connecting and disconnecting the internal circuit 3 and the testing pads 7. Before the semiconductor integrated circuit 1 is cut apart along the parting lines 2 and separated, the switches 11 are put into a connecting state, so that it is possible to input and output signals to and from the internal circuit 3 with the testing pads 7. The signal determining the on/off state of the switches 11 is an output signal from a switching element 13, which is transmitted by a wire 12.

Figure 2:
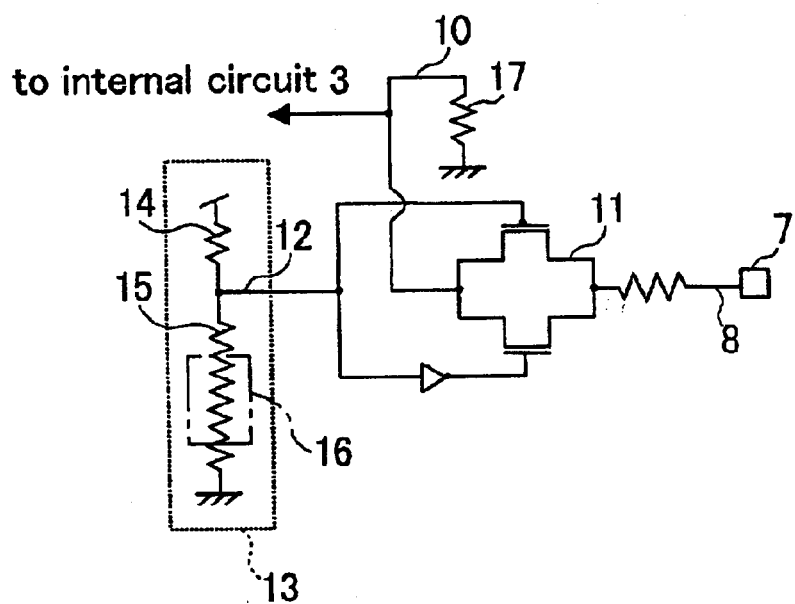
FIG. 2 is an enlarged diagram showing a switching circuit of the device in FIG. 1.

FIG. 2 shows an example of a control circuit including the switching element 13 shown in FIG. 1. The switching element 13 has a structure in which a ground power supply VSS and a power supply VDD are voltage-divided by a resistive element 14 and a resistive element 15 that has a sufficiently smaller resistance value than the resistive element 14. The on/off operation of the switch 11 is controlled by the voltage-divided power through the wire 12. Moreover, a part of the resistive element 15 (i.e., the resistive element 16 surrounded by a dotted line) is formed so as to be transverse to the parting line 2 as shown in FIG. 1, so that it is cut off with certainty at the time the semiconductor integrated circuit 1 is separated along the parting lines 2.

Herein, since the resistance value of the resistive element 15 is sufficiently smaller than that of the resistive element 14, the signal level on the wire 12 becomes approximately the same as the ground power supply VSS, and since in this situation the switch 11 is on, the internal circuit 3 is electrically connected to the testing pad 7. Moreover, the wire 10 connecting the internal circuit 3 to the switch 11 is weakly pulled down to the ground power supply VSS via a resistance 17.

On the other hand, when the test step of the semiconductor integrated circuit 1 has been completed and when the step of separating the semiconductor integrated circuits 1 along the parting lines 2 in order to obtain the products has been completed, the resistive element 16 is cut off. Thereby, the signal level on the wire 12 becomes approximately that of the power supply VDD and thus the switch 11 is turned off, so that the internal circuit 3 is electrically disconnected from the testing pad 7. In this situation, also the testing pad 7 is cut off simultaneously and the wire 8 connected to the testing pad is cut off. Accordingly, the cutting plane may be short-circuited with the ground power supply VSS, the power supply VDD or any of the other signal lines, so that the signal level on the wire 8 may change in some cases. However, since the switch 11 has been turned off and the wire 10 connected to the internal circuit 3 is weakly pulled down to the ground power supply VSS via the resistance 17, the signal level through the wire 10 is securely fixed at the ground power supply VSS constantly.

Thus, the influence of the cutting plane due to cutting away the multiple testing pads 7 can be prevented simply by arranging the switching element 13 in one or more locations in the semiconductor integrated circuit 1.

Furthermore, using a polysilicon resistor having a small malleability as the resistive element 15 arranged on the parting line 2 is effective to prevent the cutting plane of the resistive element 15 from being short-circuited with the other signal lines when it is cut off along the parting line 2.

Embodiment 2

Figure 3:
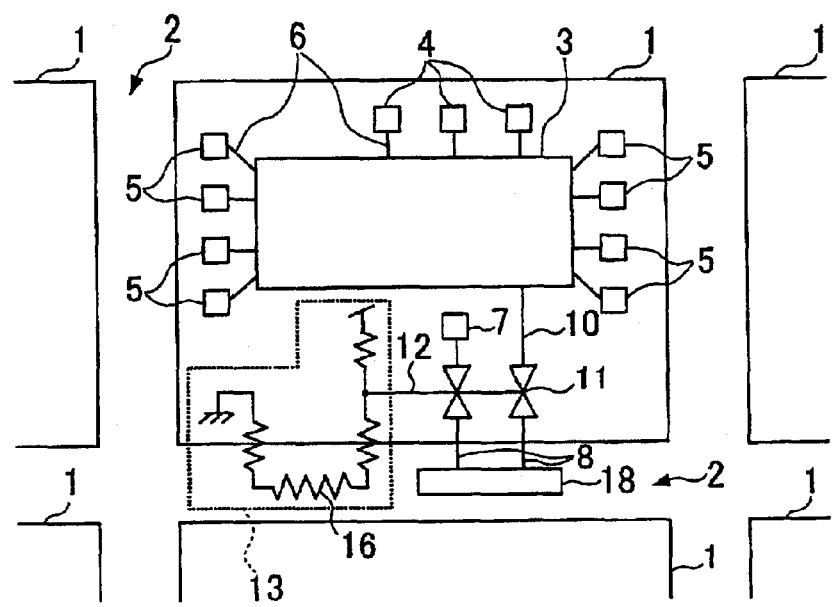
FIG. 3 is a partial plan view showing a semiconductor device according to Embodiment 2.

FIG. 3 shows a semiconductor device according to Embodiment 2. In this semiconductor device, the area of the semiconductor integrated circuit 1 is reduced by arranging an testing circuit 18, which used to be arranged within the semiconductor integrated circuit 1, on the parting line 2. Also in this case, the switches 11 are arranged between the wires 8 and the wires 10 that connect the testing circuit 18 to the internal circuit 3. The switches 11 are turned on and off by the switching element 13 connected via the wire 12. The switching element 13 has a resistive element 16 arranged on the parting line 2. Accordingly, even when the testing circuit 18 is cut away during the separation along the parting line 2 and the cutting plane of the wire 8 is short-circuited with the ground power supply VSS, the power supply VDD or any of the other signal lines, it is possible to prevent the internal circuit 3 from being affected, because the resistive element 16 is cut off simultaneously and the switches 11 are turned off.

As shown in FIG. 3, the resistive element 16 in the switching element 13 of this embodiment is not transverse to the parting line 2 as in the case of FIG. 1, but arranged in the U-letter shape such that it is pulled out to the center of the parting line 2, for example, to a sufficient extent so that the resistive element 16 can be cut off reliably during the separation along the parting line.

Furthermore, the testing pad 7 is positioned within the semiconductor integrated circuit 1, so that the testing pad 7 is not cut away when the semiconductor integrated circuits 1 are separated along the parting lines 2. Also in this case, it is possible to prevent the influence of the cutting plane from affecting the internal circuit via the testing pad 7 by arranging the switch 11 on the wire connecting the testing pad 7 to the testing circuit 18, even when the testing pad 7 is connected electrically to the other testing pads 4 or the bonding pads 5 after the packaging process, for example.

Embodiment 3

Figure 4:
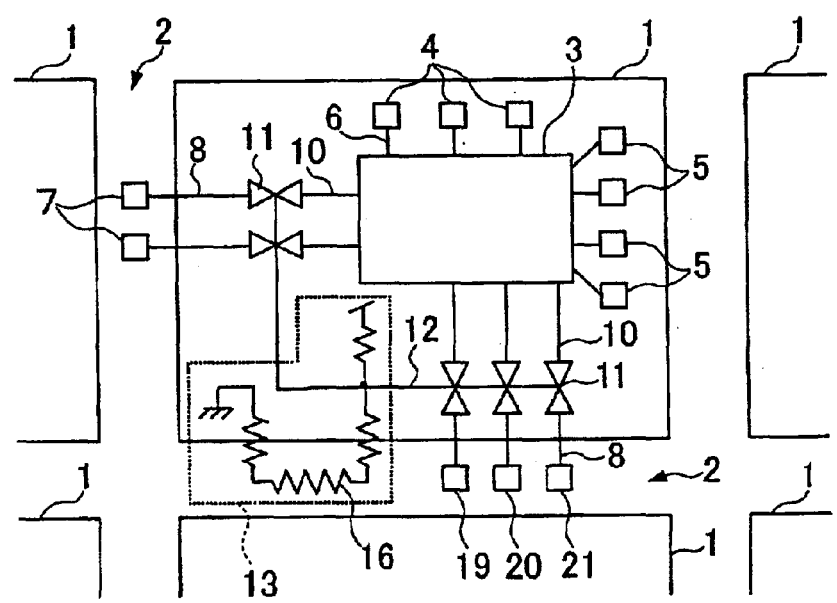
FIG. 4 is a partial plan view showing a semiconductor device according to Embodiment 3.

FIG. 4 shows a semiconductor device according to Embodiment 3. In this semiconductor device, the area of the semiconductor integrated circuit 1 is reduced by arranging pads 19, 20 and 21 for selecting the operation mode of the semiconductor integrated circuit 1 on the parting line 2.

The mode of operation of the semiconductor integrated circuit 1 can be changed by inputting and outputting signals to and from the operation mode selector pads 19, 20 and 21 at a predetermined timing. For example, in one mode of operation, it is possible to test memory, so that it becomes possible to read and write memory data by using the testing pad 4, the testing pad 7 or the like. Alternatively, in another mode of operation, it is possible to test digital circuit characteristics, so that it becomes possible to input and output data regarding the digital circuit characteristics by using the testing pad 4, the testing pad 7 or the like. Examples of means for changing these modes of operation are as follows. The mode of operation can be changed into a desired mode of operation, for example, by inputting a signal "001001" (wherein "1" stands for a signal of high voltage level and "0" for a signal of low voltage level) serially to the operation mode selector pad 19 at a predetermined timing, or by inputting "0" to the operation mode selector pad 19, "1" to the operation mode selector pad 20 and "0" to the operation mode selector pad 21 respectively at a predetermined timing. It is possible to provide any suitable number of these operation mode selector pads 19, 20 and 21.

In a structure in which the operation mode selector pads 19, 20 and 21 are arranged on the parting line 2, the operation mode selector pads 19, 20 and 21 are cut away during the separation along the parting line 2. As a result, the cutting planes of the wires 8 may be short-circuited with the ground power supply VSS, the power supply VDD or any of the other signal lines, and thus, the mode of operation may be changed into a mode which is different from that during ordinary use, which may lead to malfunctions. Moreover, since the mode of operation may be changed into modes that are different from that during ordinary use, internal data can be read and written easily, so that security problems may occur.

For that reason, the operation mode selector pads 19, 20 and 21 are connected to the internal circuit 3 via the wires 8, the wires 10 and the switches 11, as shown in FIG. 4. As in the case of FIG. 3, the switches 11 are controlled in accordance with the state of the resistive element 16 arranged on the parting line 2 and turned on and off by a signal transmitted by the wire 12. Thus, when the plurality of semiconductor integrated circuits 1 are cut apart along the parting lines 2 after the test, all of the switches 11 are turned off as soon as the operation mode selector pads 19, 20 and 21 are cut away. Since the wires 10 are weakly pulled down to the ground power supply VSS, this state is equivalent to the case that "0" is inputted to all of the operation mode selector pads 19, 20 and 21. After the separation of the semiconductor integrated circuits 1, this state stays fixed at all times. A constantly stabilized mode of operation can be achieved by setting this state as the ordinary mode of operation.

Moreover instead of being weakly pulled down to the ground power supply VSS, it is also possible to pull the wires 10 connected to the respective operation mode selector pads 19, 20 and 21 weakly up to the power supply VDD. For example, if the wires 10 connected to the operation mode selector pad 19 and the operation mode selector pad 21 are weakly pulled down to the ground power supply VSS and if the wire 10 connected to the operation mode selector pad 20 is weakly pulled up to the power supply VDD, then the state, in which the resistive element 16 is cut off as soon as the semiconductor integrated circuits 1 are cut apart along the parting lines 2 after the test, is equivalent to the case that "0", "1" and "0" are inputted into the operation mode selector pads 19, 20 and 21, respectively. It is possible to achieve a constantly stabilized mode of operation by setting this state as the ordinary mode of operation.

Moreover, since this state is fixed as the ordinary mode of operation at this time, the testing function of the testing pads 7 becomes ineffective regardless of whether the switches 11 arranged between the connection of the testing pads 7 and the internal circuit 3 are turned on or off, so that it becomes impossible to read and write the memory data of the internal circuit 3 or to test digital circuit characteristics by using the testing pads 7 or the wires 8 and the wires 10 connected to the testing pads 7. Therefore, high security can be assured after the semiconductor integrated circuits 1 are separated along the parting lines 2.

Even when the testing pads 7 and the operation mode selecting pads 19, 20 and 21 are arranged not on the parting lines 2 but on the semiconductor integrated circuit 1, the resistive element 16 can be cut off when separating the semiconductor integrated circuits 1 along the parting lines 2, by arranging the resistive element 16 on the parting line 2, so that the mode of operation can be fixed. Accordingly, it becomes impossible to input and output signals to and from the testing pads 7 and the operation mode selector pads 19, 20 and 21, which makes it possible to assure a high security. If the testing pads 7 and the operation mode selector pads 19, 20 and 21 are arranged on the parting lines 2, then the pads for inputting and outputting signals are physically cut off when the semiconductor integrated circuits 1 are separated along the parting lines 2, so that an even higher security can be assured.

Embodiment 4

Figure 5:
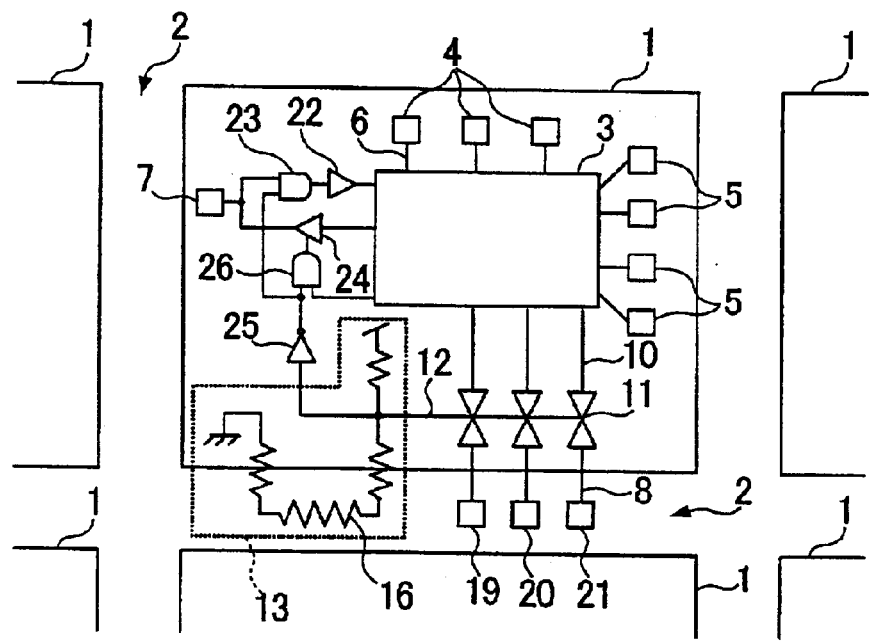
FIG. 5 is a partial plan view showing a semiconductor device according to Embodiment 4.
Figure 6:
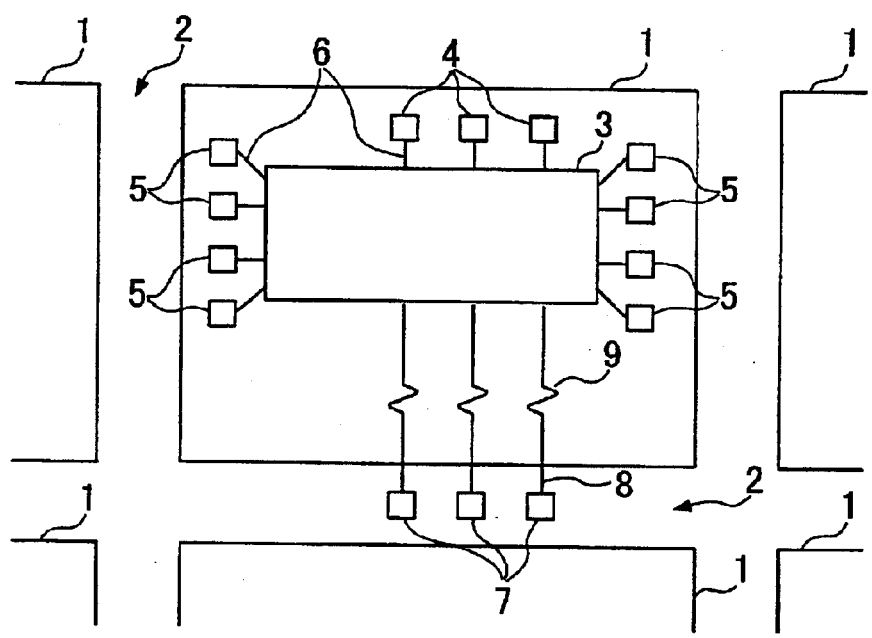
FIG. 6 is a partial plan view showing a conventional semiconductor device.

FIG. 5 shows a semiconductor device according to Embodiment 4. In this semiconductor device, the testing pad 7 for inputting and outputting signals between the internal circuit 3 formed in the semiconductor integrated circuit 1 and the outside is arranged not on the parting line 2 but within the semiconductor integrated circuit 1, and a signal that has been inputted to the testing pad 7 is inputted to the internal circuit 3 via a buffer element 22 and an AND logic element 23, whereas a signal from the internal circuit 3 is outputted to the testing pad 7 via a switch buffer element 24.

In addition, an output signal from the switching element 13 is inputted to a NOT logic element 25 via the wire 12. An output signal from the NOT logic element 25 is inputted to one input terminal of the AND logic element 23 as well as to one input terminal of an AND logic element 26 that turns the switch buffer element 24 on and off.

Before the semiconductor integrated circuits 1 are separated along the parting lines 2, the resistance 16 in the switching element 13 is connected, so that the output signal from the switching element 13 is at a low voltage level and the signal inputted to the AND logic element 23 via the NOT logic element 25 is at a high voltage level. When the input from the AND logic element 26 is controlled to a low voltage level signal with the internal circuit 3, the switch buffer element 24 is in a disconnecting state, and thus, the signal that has been inputted to the testing pad 7 is inputted to the internal circuit 3 as is. Moreover, when the input from the AND logic element 26 is controlled to a high voltage level signal, the output from the internal circuit 3 is outputted to the testing pad 7 as is, via the switch buffer element 24 that is in a connecting state. Thus, various types of tests of the semiconductor integrated circuit 1 can be performed.

On the other hand, after the semiconductor integrated circuits 1 are separated along the parting lines 2, the resistance 16 in the switching element 13 is cut off and the output signal from the switching element 13 becomes a high voltage level signal. Thus, the signal inputted to the AND logic element 23 via the NOT logic element 25 becomes a low voltage level signal. Accordingly, the output signal from the AND logic element 23 becomes a low voltage level signal regardless of the signal inputted to the testing pad 7, so that if a low signal is inputted to the testing pad 7, a low voltage level signal is inputted into the internal circuit 3 at all times. Also when the signal is outputted from the internal circuit 3, the switch buffer element 24 controlled by the AND logic element 26 is in a disconnecting state regardless of the signal outputted from the internal circuit 3. In this manner, also with the configuration using logic element control, it becomes impossible to read and write the memory data of the internal circuit 3 or to test digital circuit characteristics by using the testing pad 7, so that high security can be assured.

According to the present invention, a wiring pattern controlling the on/off state of a switch for switching the connection between the internal circuit of the semiconductor integrated circuit and the testing pad or the testing circuit is arranged on a parting line, and thus, it is possible to ensure that the wiring pattern is cut off when the semiconductor integrated circuit is separated along the parting lines, such that the internal circuit is not affected by the influence due to any of the cutting planes.

Moreover, it is possible to prevent the influence due to any of the cutting planes from affecting the internal circuit simply by separating the semiconductor integrated circuit along the parting lines, which is a step that has been performed conventionally, and without requiring additional steps and increasing testing time.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A semiconductor device comprising:
a plurality of semiconductor integrated circuits formed on a semiconductor wafer;
a testing pad for inputting and outputting a signal to and from an internal circuit of the semiconductor integrated circuit;
a switch that switches a state of a connection between the internal circuit and the testing pad; and
a wiring pattern including first, second and third portions, the first portion being connected to a first power supply at one end and to a wire for supplying a signal for controlling the on/off state of the switch at another end, the second portion being provided between the another end of the first portion and one end of the third portion and formed on a parting line around the semiconductor integrated circuit, and the third portion being connected to a second power supply at another end.

2. A semiconductor device comprising:
a plurality of semiconductor integrated circuits formed on a semiconductor wafer;
a testing circuit for testing the semiconductor integrated circuit, which is formed on a parting line around the semiconductor integrated circuit;
a testing pad for inputting and outputting a signal to and from the testing circuit;
a switch that switches respective states of a connection between an internal circuit of the semiconductor integrated circuit and the testing circuit and a connection between the testing circuit and the testing pad; and
a wiring pattern including first, second and third portions, the first portion being connected to a first power supply at one end and to a wire for providing a signal for controlling the on/off state of the switch at another end, the second portion being provided between the another end of the first portion and one end of the third portion and formed on the parting line, and the third portion being connected to a second power supply at another end.

3. A semiconductor device comprising:
a plurality of semiconductor integrated circuits formed on a semiconductor wafer;
an operation mode selector pad for switching a mode of operation of the semiconductor integrated circuit;
a switch that switches a state of connection between an internal circuit of the semiconductor integrated circuit and the operation mode selector pad; and
a wiring pattern including first, second and third portions, the first portion being connected to a first power supply at one end and to a wire for providing a signal for controlling the on/off state of the switch at another end, the second portion being provided between the another end of the first portion and one end of the third portion and formed on a parting line around the semiconductor integrated circuit, and the third portion being connected to a second power supply at another end.

4. The semiconductor device according to claim 1, wherein the wiring pattern is formed such that it leads from inside each of the semiconductor integrated circuits over the parting line and is then connected to the inside of the same semiconductor integrated circuit; and
the wiring pattern is arranged such that it is cut off when the plurality of the semiconductor integrated circuits are separated along the parting lines.

5. The semiconductor device according to claim 4, wherein the cutting off of the wiring pattern causes the switch to be turned from on to off, so that the input/output processing of signals to and from the testing pad is made electrically ineffective.

6. The semiconductor device according to claim 4, wherein the cutting off of the wiring pattern causes an output signal from the switch to be fixed, so that the input/output processing of signals to and from the testing pad is made electrically ineffective.

7. The semiconductor device according to claim 3, wherein the wiring pattern is formed such that it leads from inside each of the semiconductor integrated circuits over the parting line and is then connected to the inside of the same semiconductor integrated circuit; and the wiring pattern is arranged such that it is cut off when the plurality of the semiconductor integrated circuits are separated along the parting lines.

8. The semiconductor device according to claim 7, wherein the cutting off of the wiring pattern causes the switch to be turned from on to off, so that the input/output processing of signals to and from the operation mode selector pad is made electrically ineffective.

9. The semiconductor device according to claim 7, wherein the cutting off of the wiring pattern causes an output signal from the switch to be fixed, so that the input/output processing of signals to and from the operation mode selector pad is made electrically ineffective.

10. The semiconductor device according to claim 7, wherein the cutting off of the wiring pattern causes the mode of operation of the semiconductor integrated circuit to be fixed.

11. A method for fabricating a semiconductor integrated circuit device comprising the steps of:

providing a semiconductor wafer comprising a plurality of semiconductor integrated circuits formed thereon, a testing pad for inputting and outputting a signal to and from an internal circuit of the semiconductor integrated circuit, a switch that switches a state of a connection between the internal circuit and the testing pad, and a wiring pattern including first, second and third portions, the first portion being connected to a first power supply at one end and to a wire for supplying a signal for controlling the on/off state of the switch at another end, the second portion being provided between the another end of the first portion and one end of the third portion and formed on a parting line around the semiconductor integrated circuit, and the third portion being connected to a second power supply at another end;

testing the plurality of semiconductor integrated circuit using the testing pad; and cutting apart the plurality of semiconductor integrated circuits along the parting line.

12. A method for fabricating a semiconductor integrated circuit device comprising the steps of:

providing a semiconductor wafer comprising a plurality of semiconductor integrated circuits formed thereon, a testing circuit for testing the semiconductor integrated circuit, which is formed on a parting line around the semiconductor integrated circuit, a testing pad for inputting and outputting a signal to and from the testing circuit, a switch that switches respective states of a connection between an internal circuit of the semiconductor integrated circuit and the testing circuit and a connection between the testing circuit and the testing pad, and a wiring pattern including first, second and third portions, the first portion being connected to a first power supply at one end and to a wire for providing a signal for controlling the on/off state of the switch at another end, the second portion being provided between the another end of the first portion and one end of the third portion and formed on the parting line, and the third portion being connected to a second power supply at another end;

testing the plurality of semiconductor integrated circuit using the testing pad; and cutting apart the plurality of semiconductor integrated circuits along the parting line.

13. A method for fabricating a semiconductor integrated circuit device comprising the steps of:

providing a semiconductor wafer comprising a plurality of semiconductor integrated circuits formed thereon, an operation mode selector pad for switching a mode of operation of the semiconductor integrated circuit, a switch that switches a state of connection between an internal circuit of the semiconductor integrated circuit and the operation mode selector pad, and a wiring pattern including first, second and third portions, the first portion being connected to a first power supply at one end and to a wire for providing a signal for controlling the on/off state of the switch at another end, the second portion being provided between the another end of the first portion and one end of the third portion and formed on a parting line around the semiconductor integrated circuit, and the third portion being connected to a second power supply at another end;

selecting an operation mode by applying a signal for changing an operation mode to the operation mode selector pad; and cutting apart the plurality of semiconductor integrated circuits along the parting line.

* * * * *